US010593778B1

(12) United States Patent
Basaran et al.

(10) Patent No.: US 10,593,778 B1
(45) Date of Patent: Mar. 17, 2020

(54) ELECTROSTATIC DOPING-BASED ALL GNR TUNNEL FIELD-EFFECT TRANSISTOR

(71) Applicants: Cemalettin Basaran, Medina, NY (US); Weixiang Zhang, Buffalo, NY (US); Tarek Ragab, Jonesboro, AR (US)

(72) Inventors: Cemalettin Basaran, Medina, NY (US); Weixiang Zhang, Buffalo, NY (US); Tarek Ragab, Jonesboro, AR (US)

(73) Assignee: Cemalettin Basaran, Medina, NY (US)

( * ) Notice: Subject to any disclaimer, the term of this patent is extended or adjusted under 35 U.S.C. 154(b) by 0 days.

(21) Appl. No.: 16/413,049

(22) Filed: May 15, 2019

Related U.S. Application Data

(60) Provisional application No. 62/811,099, filed on Feb. 27, 2019.

(51) Int. Cl.
H01L 29/66 (2006.01)

(52) U.S. Cl.
CPC .. *H01L 29/66015* (2013.01); *H01L 29/66219* (2013.01); *H01L 29/66977* (2013.01)

(58) Field of Classification Search
CPC ............. H01L 29/12; H01L 29/1606; H01L 29/66015; H01L 29/66022; H01L 29/66037; H01L 29/66045; H01L 2924/13088
See application file for complete search history.

(56) References Cited

U.S. PATENT DOCUMENTS

| 9,362,919 | B1* | 6/2016 | Sedighi | H01L 29/127 |
| 2013/0313524 | A1* | 11/2013 | De Micheli | H01L 29/775 257/29 |
| 2014/0152291 | A1* | 6/2014 | Afzali-Ardakani | B82Y 30/00 324/71.1 |
| 2014/0176186 | A1* | 6/2014 | Lee | H01L 29/1606 326/38 |
| 2016/0049475 | A1* | 2/2016 | Bol | H01L 29/1606 257/29 |
| 2016/0155839 | A1* | 6/2016 | Strachan | H01L 29/66825 257/29 |
| 2018/0337201 | A1* | 11/2018 | Yan | H01L 29/41733 |
| 2019/0233282 | A1* | 8/2019 | Kusakabe | B01D 53/0438 |

OTHER PUBLICATIONS

Johari et al., Modelling of Graphene Nanoribbon Fermi Energy, Dec. 30, 2019, Journal of Nanomaterials, (Year: 2019).*

* cited by examiner

Primary Examiner — Eduardo A Rodela

(57) ABSTRACT

The present invention disclose an Electrostatic doping (ED)-based graphene nanoribbon (GNR) tunneling field-effect transistor (TFET) with tri-gate design. This device uses hydrogen-passivated GNR heterojunction as a carrier path way and functions as a power switch providing a switching speed of ~0.3 ps$^{-1}$ an $I_{ON}/I_{OFF}$ ratio as high as $10^{14}$ with the on-state current in the order of $10^3$ μA/μm. This disclosed invention consists of two electrode, two electrode extensions, six metallic gate regions, and six dielectric regions.

1 Claim, 1 Drawing Sheet

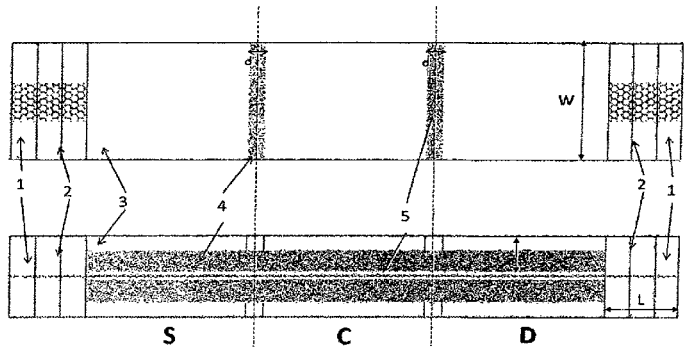

Schematic view of electrostatic doping based GNR TFET. Fig.1 top view. Fig.2 side view.

1. Electrode made of Eleven-dimer Armchair Graphene Nano Ribbon.

2. Electrode extension made of Eleven-dimer Armchair Graphene Nano Ribbon.

3. Metallic gate region (white) made of copper, thickness 0.5 nm.

4. Dielectric region (pink) made of diamond, thickness 0.8 nm.

5. Nine-dimer Armchair Graphene Nano Ribbon.

The whole GNR TFET device is divided into three regions by two vertical dotted lines, into S, the source region, C, the channel region, and D, the Drain region. The GNR TFET device has a width W = 4.7 nm, electrode & electrode extension length L equals 2.575 nm, and metallic and dielectric region thickness T equals 1.3nm. The gate-to-gate distance d equals 0.6 nm.

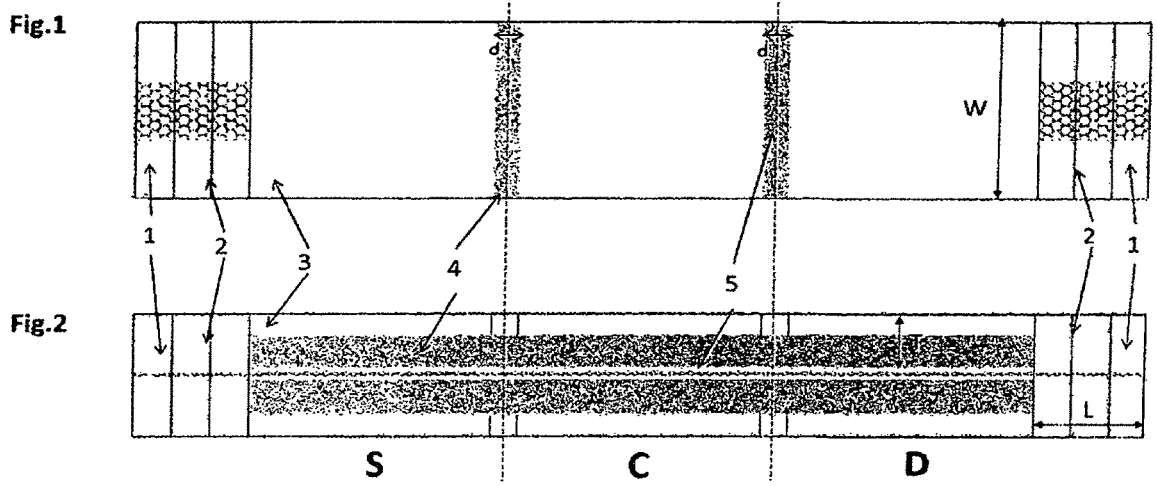

Schematic view of electrostatic doping based GNR TFET. Fig.1 top view. Fig.2 side view.

1. Electrode made of Eleven-dimer Armchair Graphene Nano Ribbon.

2. Electrode extension made of Eleven-dimer Armchair Graphene Nano Ribbon.

3. Metallic gate region (white) made of copper, thickness 0.5 nm.

4. Dielectric region (pink) made of diamond, thickness 0.8 nm.

5. Nine-dimer Armchair Graphene Nano Ribbon.

The whole GNR TFET device is divided into three regions by two vertical dotted lines, into S, the source region, C, the channel region, and D, the Drain region. The GNR TFET device has a width W = 4.7 nm, electrode & electrode extension length L equals 2.575 nm, and metallic and dielectric region thickness T equals 1.3nm. The gate-to-gate distance d equals 0.6 nm.

ELECTROSTATIC DOPING-BASED ALL GNR TUNNEL FIELD-EFFECT TRANSISTOR

CROSS-REFERENCE TO RELATED APPLICATION

This application claims the benefits of U.S. Provisional Application No. 62/811,099, filed Feb. 27, 2019.

STATEMENT REGARDING FEDERALLY SPONSORED RESEARCH OR DEVELOPMENT

This invention was made with government support under a grant No. N00014-151-2216 awarded by Office of Naval Research. The government has certain rights in the invention.

TECHNICAL FIELD

Field-Effect Transistors, applicable for power electronics and computer chips.

BACKGROUND OF THE INVENTION

The Moore's law suggests that the size of transistors would scale down exponentially so that we can benefit from the ever better performance of computers. However, the physical limit of Si-based transistors is approaching at which point the quantum tunneling occurs and the transistor would fail to switch between on and off states.

BRIEF SUMMARY OF THE INVENTION

The graphene nanoribbon (GNR) is a promising candidate to solve this challenge. We propose the Electrostatic Doping Based All GNR Tunnel Field Effect Transistor (TFET) which provides fast switching speed (~0.3 $ps^{-1}$) and very high on/off state current ratio (~$10^{14}$) with short channel length (<10 nm) and much smaller device size compared to the widely used Si-based FinFET and MOSFET. With the proposed device structure, the requirement of Moore's law can be met and the transistor size can be scaled down continuously.

Compared with other candidates, the use of GNR ensures that our device is much chemically and mechanically stable and does not require an additional encapsulation outside the materials. Therefore it has a simpler structure and can be more easily fabricated.

BRIEF DESCRIPTION OF THE DRAWING

Schematic view of electrostatic doping based GNR TFET. FIG. 1 top view. FIG. 2 side view.

1. Electrode made of 11-dimmer Armchair GNR.
2. Electrode extension made of 11-dimmer Armchair GNR.
3. Metallic gate region (white) made of copper, thickness 0.5 nm.
4. Dielectric region (pink) made of diamond, thickness 0.8 nm.
5. 9-dimmer Armchair GNR.

The whole GNR TFET device is divided into three regions by two vertical dotted lines, into S, the source region, C, the channel region, and D, the Drain region. The GNR TFET device has a width W=4.7 nm, electrode & electrode extension length L equals 2.575 nm, and metallic and dielectric region thickness T equals 1.3 nm. The gate-to-gate distance d equals 0.6 nm.

DETAILED DESCRIPTION OF THE INVENTION

The ED-based GNR-TFET consists of five regions: a finite intrinsic channel where carriers are transported through, n-type doped source and p-type doped drain, two semi-infinite electrodes and their extensions, metallic gates and dielectric insulator between the gates and the GNR. A tri-gate design is employed in which the source/drain side gates are provided with independent built-in voltages to electrostatically dope the source/drain, while the mid-gate is provided with varying voltages which controls the opening and closing of the channel conduction. In order to strengthen the gate electrostatic control over the channel, we adopted double-side gates to sandwich the GNR. The thickness of the dielectric region is of ~1 nm with the dielectric constant of 5.7. The channel and electrodes are all made of GNR, avoiding possible formation of Schottky barrier at the channel and electrode interface, which would increase the parasitic contact resistance and deteriorate the device performance. Instead of having AGNR of uniform width throughout the whole regions, we employed a semimetal-semiconductor-semimetal sandwiched structure, which is required for designing transistor devices. Concretely, the source, channel, and drain regions are made of semi-conductive 3p family AGNR, while the electrodes and electrode extensions are made of nearly metallic 3p+2 family AGNR. The sub-2 nm wide edge roughness free Armchair GNR (AGNR) is used in our simulations. In order to minimize the geometric difference at the (3p+2)–(3p)–(3p+2) AGNR hetero-junction interface so that ribbon-width-mismatch effect on device performance is negligible, the same value of p was used for all three regions. Moreover, Hydrogen passivation is provided for end atoms on both sides of the GNR which is the most stable thermal configuration for the carbon atoms on the edge.

The invention claimed is:

1. An energy-efficient transistor model for power switch application comprising the following:
 a carrier path made of hydrogen-passivated armchair Graphene Nano-ribbon (GNR) heterojunction, which can be divided into three sections:
 a channel made of 3p dimmer armchair GNR (p is integer number greater than 3), a source and a drain made of same type 3p+2 dimmer armchair GNR, the value of p takes same value for channel, source and drain,
 two electrodes, made of the same material with the source and drain, connected to source and drain at the two ends, respectively,
 two doping gate at left/right sides of the device, sandwiching the source and drain part of the GNR path,
 one control gate in the middle of the device, sandwiching the channel part of the GNR path,
 the gates are made of two layers:
 copper in the top layer and diamond in the bottom layer,
 the doping gates at source and drain are applied with opposite voltages and the control gate is applied with a voltage range between −1.5V to +1.5V, where the device is functioning, the transistor can function as a power switch with a large on/off current ratio of 10^15.

* * * * *